United States Patent [19]
Vickers

[11] Patent Number: 6,064,682
[45] Date of Patent: May 16, 2000

[54] DELAYING OF LASER PULSES

[75] Inventor: Anthony John Vickers, Colchester, United Kingdom

[73] Assignee: Wivenhoe Technology Limited, United Kingdom

[21] Appl. No.: 08/901,001

[22] Filed: Jul. 25, 1997

Related U.S. Application Data

[60] Provisional application No. 60/021,007, Jul. 26, 1996.

[51] Int. Cl.$^7$ ........................................................ H01S 3/00
[52] U.S. Cl. .................................................. 372/38; 372/25
[58] Field of Search .......................................... 372/38, 25

[56] References Cited

U.S. PATENT DOCUMENTS

| | | | |
|---|---|---|---|
| 5,311,531 | 5/1994 | Brindel et al. | 372/38 |
| 5,477,367 | 12/1995 | van der Heijden | 372/38 |
| 5,519,362 | 5/1996 | Li et al. | 372/38 |

OTHER PUBLICATIONS

D.G. McLean, M.G. Roe, A.I. D'Souza and P.E. Wigen, Apr. 14, 1986, Picosecond recombination of charged carriers in GaAs, *Appl Phys. Lett.* 48 (15).

Janis A. Valdmanis and G. Mourou, Jan. 1986, Subpicosecond Electrooptic Sampling: Principles and Applications, *IEEE Journal of Quantum Electronics*, vol. QE–22, No. 1.

T.F. Carruthers and J.F. Weller, Feb. 17, 1986, Picosecond optical mixing in fast photodetectors, *Appl. Phys. Lett.* 48 (7).

D.C. Edelstein, R.B. Rommney and M. Scheuermann, Mar. 1991, Rapid programmable 300 ps optical delay scanner and signal–averaging system for ultrafast measurements, *Rev. Sci. Instrum.* 62 (3).

A. Egan, J. O'Gorman, P. Rees, G. Farrell, J. Hegarty and P. Phelan, May 11, 1995, Frequency dependence of phase between synchronised self–pulsating laser emission and injected periodic electrical signals, *Electronics Letters*, vol. 31, No. 10.

Patricia M. Downey, John E. Bowers, 1987, Picosecond Dynamics of a Gain–Switched in GaAsP Laser, *IEEE J. Quantum Electron*, QE–23 (1987) 1039.

P. Gunning, R. Kashyap, A.S. Siddiqui and K. Smith, Jun. 22, 1995, Picosecond pulse generation of <5ps from gain–switched DFB Semiconductor laser diode using linearly step–chirped fibre grating, *Electronics Letters*, vol. 31, No. 13, pp. 1066–1067.

*Primary Examiner*—James W. Davie
*Assistant Examiner*—Robert E. Wise
*Attorney, Agent, or Firm*—McGlew and Tuttle, P.C.

[57] ABSTRACT

A semiconductor laser powered by both a dc current and an rf current. Varying the level of the dc current changes the shape, power and timing of a pulse emitted by the laser. The laser emits pulses in response to the leading or rising edge of the rf current. The time between the leading edge of the rf current and the emission of the pulse has been found to vary with the level of the dc current. Correspondingly, the shape and power of the emitted pulse also varies with the varying of the dc current. Further the shape, power and timing of the pulse varies with variations in the rf current. The present invention varies the dc and rf current to a laser, to vary the timing of the pulses from the rising edge, while maintaining the shape and power of the pulses substantially constant for all different variations in timing.

13 Claims, 7 Drawing Sheets

Figure 1. Theoretical results illustrating the change of pulse shape and position with variation of dc bias below threshold.

Figure 2. Theoretical results illustrating the change of pulse shape and position with variation of rf modulation depth.

Figure 3. Theoretically generated gain switched pulse of similar magnitude and FWHM at two positions in time. The dc and rf currents for the two pulses were 17.5mA dc and 1mA rf for the first pulse and 13.5mA dc and 13.7mA rf for the second pulse.

Figure 4. Experimental results from a 1.5μm DFB laser as a function of dc bias.

Figure 5 Experimental results from a 1.5μm DFB laser as a function of rf modulation depth.

Figure 6. Experimental results showing a pulse moving over 135ps whilst maintaining its shape. The dc current ranges from 11 mA to 16 mA (right to left) in 1mA steps, while the rf powers are 13 dBm, 11.8 dBm, 9.3 dBm, 7.7 dBm, 7.6 dBm and 6 dBm, again from right to left.

PROPOSED PUMP-IN DEVICE WITH DRIVER CIRCUIT

DELAYING OF LASER PULSES

This application claims benefit of Provisional Appl. 60/021,007 filed Jul. 26, 1996.

FIELD OF THE INVENTION

This invention relates to methods for the selective delaying in a controlled manner of an optical pulse from a laser, whilst substantially maintaining the shape of the pulse. The invention further relates to a laser system arranged to permit the delaying of an optical pulse from the laser, by a preselected and controlled period.

BACKGROUND OF THE INVENTION

One of the most versatile techniques used to study time resolved events on a pico- or femtosecond time scale is to use an ultrafast laser pulse to excite a material and then use a second pulse to measure the effect of the first pulse. By varying the delay between the first and second pulses a time resolved picture can be built up. This type of experiment is normally referred to as a pump-probe experiment. The technique is used in many applications such as carrier relaxation time measurements in semiconductors as described by D. G. McLEAN, M. G. ROE, A. I. D'SOUZA and P. E. WIGEN, Appl. Phys. Lett. 48 (1986) 992, electro-optic sampling as described by J. A. VALDMANIS and G. A. MOUROU, IEEE J. Quantum Electron. QE-22 (1986) 69, and electrical autocorrelation as described by T. F. CARRUTHERS and J. F. WELLER, Appl. Phys. Lett., 48 (1986) 460. The usual approach is to split the beam from a mainframe laser system, such as a mode locked solid state or dye laser, and send one half onto a mechanical delay line, such as a retro-reflector mounted on a stepper motor or a cam driven rocker arm as described by D. C. EDELSTEIN, R. B. ROMNEY and M. SCHEUERMANN, Rev. Sci. Instrum. 62 (1991) 579. A stepper motor will produce a scan range of several nanoseconds but will take some time to move over that range. In order to achieve an acceptable signal to noise ratio the time taken to acquire a set of data can be large. Rocker arm type systems will only allow for a scan range of a few hundred picoseconds or less, but will cover that range in a very short time and by using signal averaging techniques to improve the signal to noise ratio, the technique can acquire data sets in a comparatively short period of time.

Mechanical movement systems such as these are bulky and need careful alignment for good position sensitivity.

SUMMARY AND OBJECTS OF THE INVENTION

It is a primary object of the present invention to provide a novel pump-probe system using an all solid state approach to facilitate the optical delay. Such a system would be compact, easy to use and maintain, and utilises existing semiconductor laser technology, thus making it relatively inexpensive.

The present invention accomplishes this object by using a semiconductor laser that is powered by both a dc current and an rf current. It has been discovered that varying the level of the dc current changes the shape, power and timing of a pulse emitted by the laser. The laser emits pulses in response to the leading or rising edge of the rf current. The time between the leading edge of the rf current and the emission of the pulse has been found to vary with the level of the dc current. Correspondingly, the shape and power of the emitted pulse also varies with the varying of the dc current.

It has further been discovered that the shape, power and timing of the pulse varies with variations in the rf current. The present invention varies the dc and rf current to a laser, to vary the timing of the pulses from the rising edge, while maintaining the shape and power of the pulses substantially constant for all different variations in timing.

In any method for producing short pulses from semiconductor lasers by means of modulation, there will always be a relationship between the ac driving signal and the optical output, such as in electrically synchronised self-pulsing lasers where the phase of the optical pulse with respect to the synchronising ac signal changes with the level of dc bias, such is described by A. EGAN, P. PHELAN, J. O'GORMAN, P. REES, G. FARRELL and J. HEGARTY, Electron. Lett. 31 (1995) 802. I have investigated whether this relationship could be controlled to produce an in built optical delay. When gain switching a laser diode the device is held below threshold with a dc current, and is then excited above by either a short electrical pulse or an rf current. A time lag between the rising edge of the driving signal and the optical pulse is produced. It is known that this is dependant on the level of DC bias below threshold immediately before excitation as described by P. M. DOWNEY, J. E. BOWERS, R. S. TUCKER and E. AGYEKUM, IEEE J. Quantum Electron. QE-23 (1987) 1039. This technique of gain switching will in principle work with any semiconductor laser. The following discussion concentrates on gain switching distributed feedback (DFB) lasers, as this avoids the need for custom built devices and also offers single longitudinal mode operation, which is important for many applications.

By providing two lasers driven with a common rf current and an identical dc current, a series of pulses are generated at an identical frequency, and at identical times. Also the shape and power of the pulses are identical for each laser. By varying the dc and rf current on one of the lasers, the relative timing between the series of pulses is varied, while maintaining the shape and power of the pulses in each series substantially identical.

In a preferred embodiment of the present invention, the dc current and the modulation depth of the rf current are continuously varied, so that the pulse of the second laser occurs at varying times after the corresponding pulse from the first laser. This allows measurements of a reaction at different times by the pulse of the second laser when the reaction has been initiated by the pulse of the first laser.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

DETAILED DESCRIPTION OF THE PREFERRED EMBODIMENTS

In order to investigate the precise relationship between phase and bias, a model of a single mode laser with both dc and GHz rf current components was constructed. This was carried out using a FORTRAN program which used a 4th order Runge-Kutta-Merson algorithm to numerically solve the single mode rate equations over a given time period, in our case one cycle of the rf signal. The equations are $$\frac{dn}{dt} = \frac{i_{dc} + i_{ac}\sin(2\pi ft)}{eV} - g(n-n_t)s - \frac{n}{\tau_n}$$

$$\frac{ds}{dt} = g\Gamma(n-n_t)s + \Gamma\beta\frac{n}{\tau_n} - \frac{s}{\tau_p}$$

which relate the electron density, n, to the photon density, s. Other symbols represent the currents, $i_{dc}$ and $i_{ac}$, the modulation frequency, f, the gain coefficient $g=g_0/1+e_s$ where e is the gain compression factor and is small. $n_t$ is the electron density at transparency, V the volume of the active region, $t_n$ the electron lifetime and $t_p$ the photon lifetime, b the fraction of spontaneous emission coupled into the lasing mode and G is the mode confinement factor. For the purposes of this simulation the values of these parameters are taken from reference 6. Explicitly they are $e=8.0\times10^{-18}$ cm$^3$, $n_t=1\times10^{18}$cm$^{-3}$, V=23.76 μm$^3$, $t_n=1$ ns, $t_p=1$ ps, b=$10^{-4}$, G=0.35 and $g_o=1.1\times10^{-6}$ cm$^3$/s.

Figure 1:
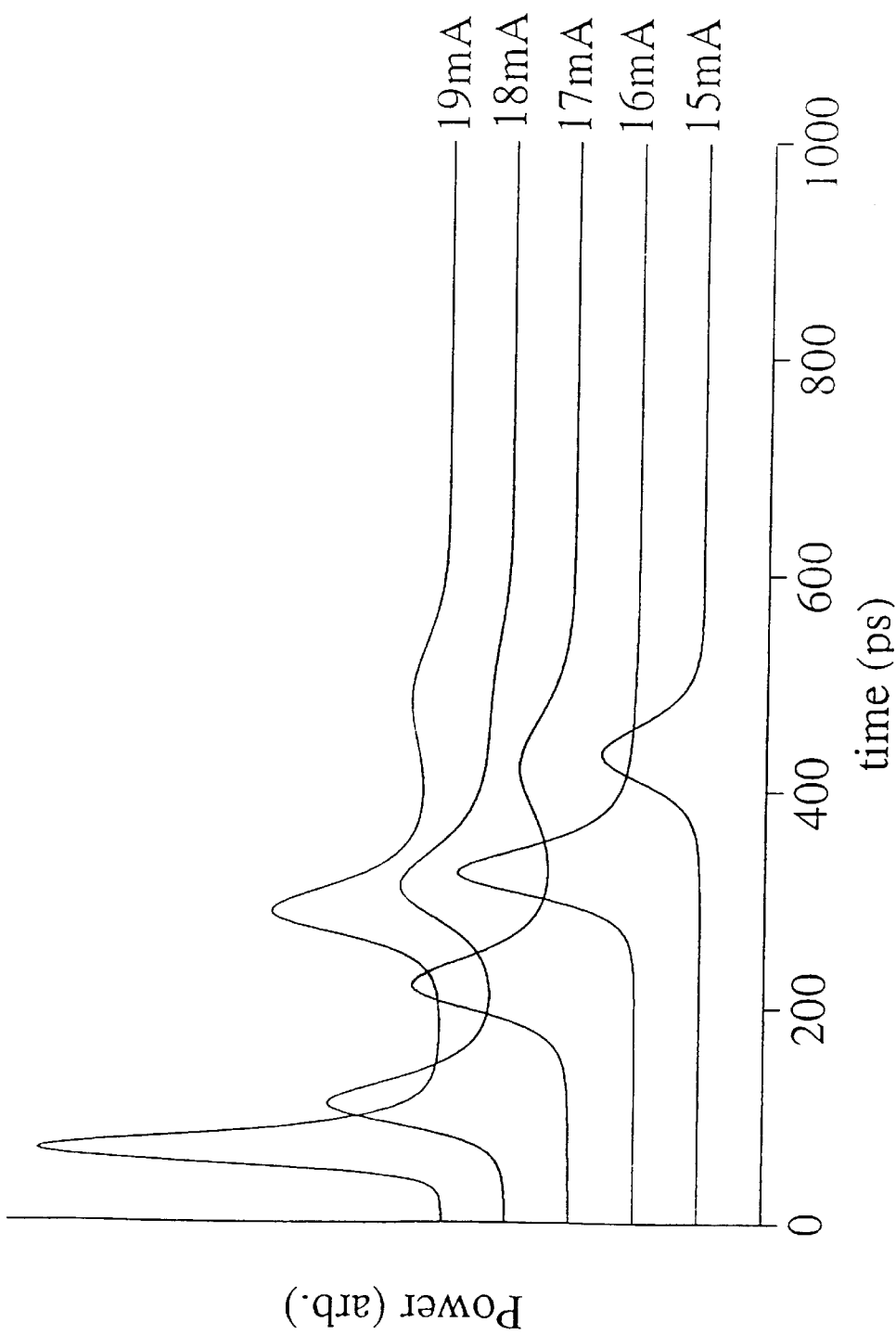
FIG. 1, is a graph of theoretical results illustrating the change of pulse shape and position with a variation of dc bias below threshold.

The program calculates the initial conditions and plots the evolution of the photon density as a function of time. The first task undertaken was to plot the change in pulse shape and arrival time with a change in dc with a fixed rf component. This is similar to the results presented by P. M. DOWNEY, J. E. BOWERS, R. S. TUCKER and E. AGYEKUM, IEEE J. Quantum Electron. QE-23 (1987) 1039. except they used a square pulse rf modulation. The results can be seen in FIG. 1. As can be seen, the pulse moved forwards as the bias approached threshold, here nominally around 20 mA, with total delay of over 400 ps. However, over this range, both the peak power and the full width half maximum (FWHM) changed considerably. Also, at higher bias levels, multiple pulse formation can be seen. Gain switching is best understood by consideration of the gain term in the rate equations. Below threshold spontaneous emission dominates and due to the comparatively long carrier lifetime for radiative recombination (~1 ns) the amount of electrons converted to photons is small thus allowing a relatively large inversion population to build up. When the rf bias component pushes the carrier density above threshold, the gain term switches on and large numbers of electrons are converted into photons by stimulated emission, thus causing the device to lase. This occurs for only a short period of time, and if this is sufficiently brief then only the first peak of the relaxation oscillation is excited and a single picosecond pulse is produced. As the dc bias increases, the laser achieves threshold sooner, so the peak moves forward, but the gain term is "on" for longer, sometimes long enough to allow the second and even the third relaxation oscillations to form. This result has been observed experimentally, and is generally undesirable.

Figure 2:
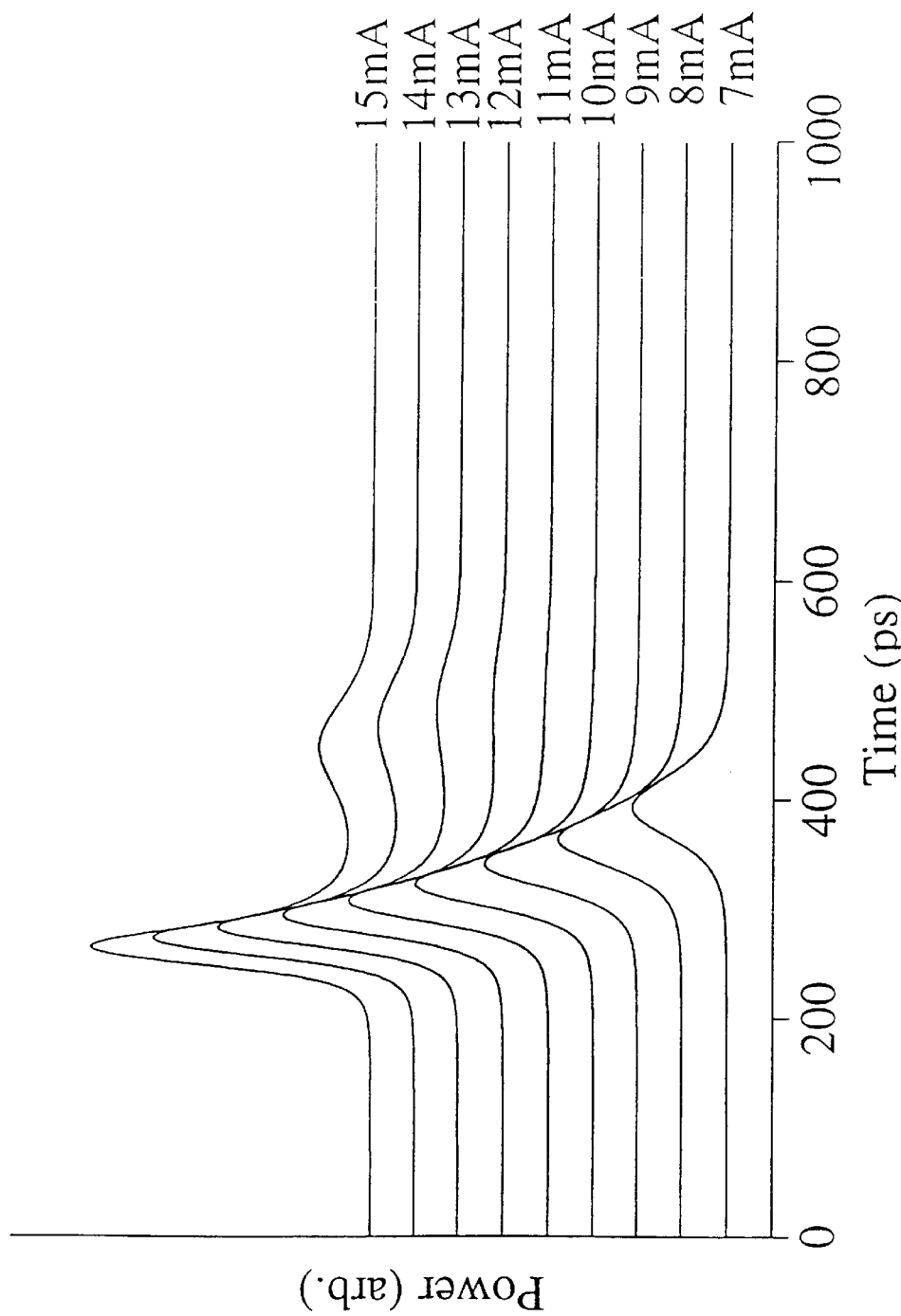
FIG. 2, is a graph of theoretical results illustrating the change of pulse shape and position with variation of rf modulation depth.
Figure 3:
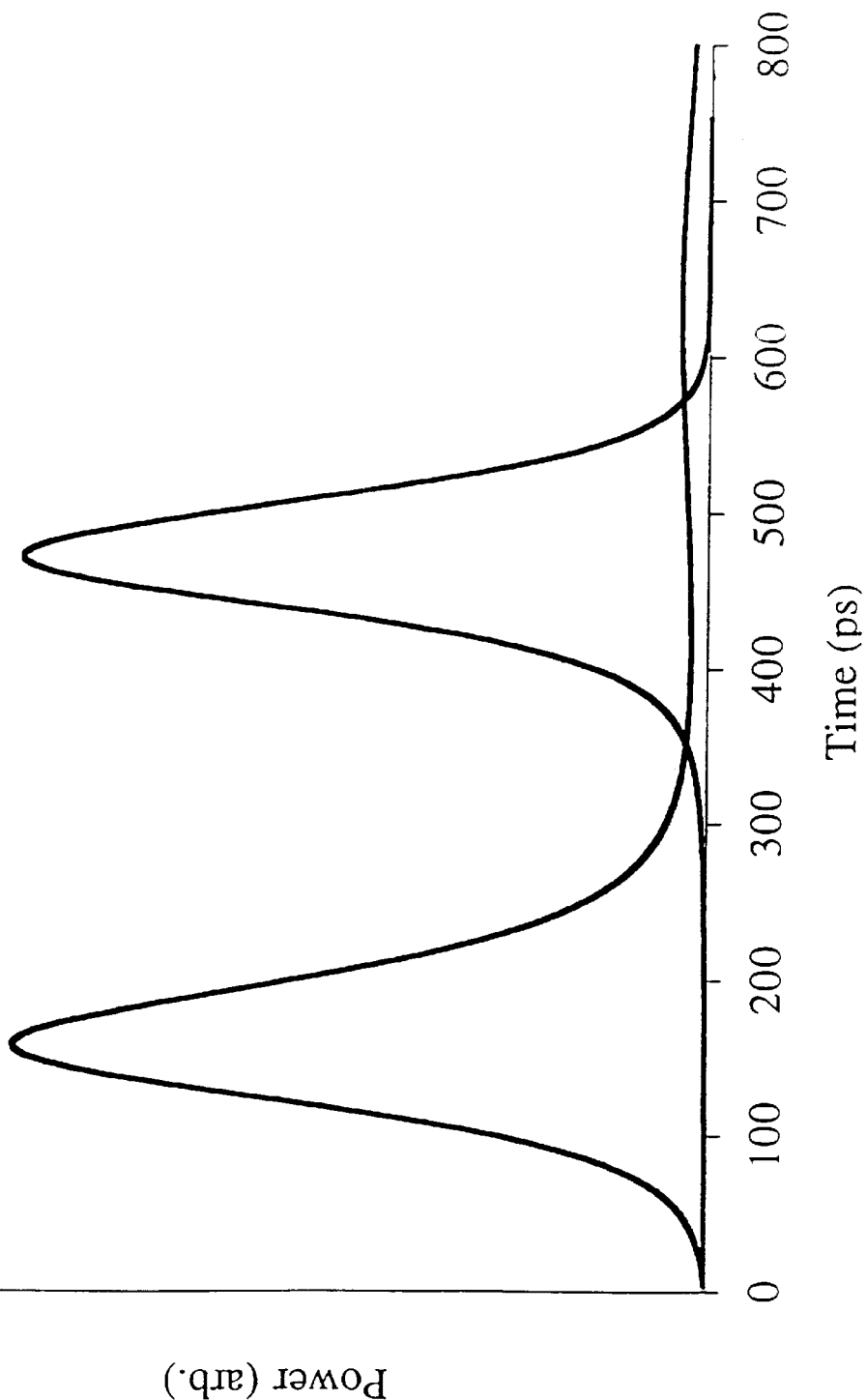
FIG. 3, is a graph of theoretically generated gain switch pulses of similar magnitude and FWHM at two positions in time, the dc and rf currents for the two pulses were 17.5 mA dc and 1 mA rf for the first pulse and 13.5 mA dc and 13.7 mA rf for the second pulse.

FIG. 2 illustrates the change with respect to rf modulation depth. As may be expected, both the peak power and the FWHM decrease with increased current, but also the peak moves forward with increased bias. This is thought to be due to the increase in slope of the rf signal, thus making the gain switch sooner and for longer, as the incidence of multiple pulses indicates. From the two theoretical results, it would seem possible by adjusting both the rf and dc bias components to move the pulse whilst preserving its shape. By trial and error, a pulse was moved by over 200 psecs whilst preserving its shape and power, as can be seen in FIG. 3.

Figure 4:
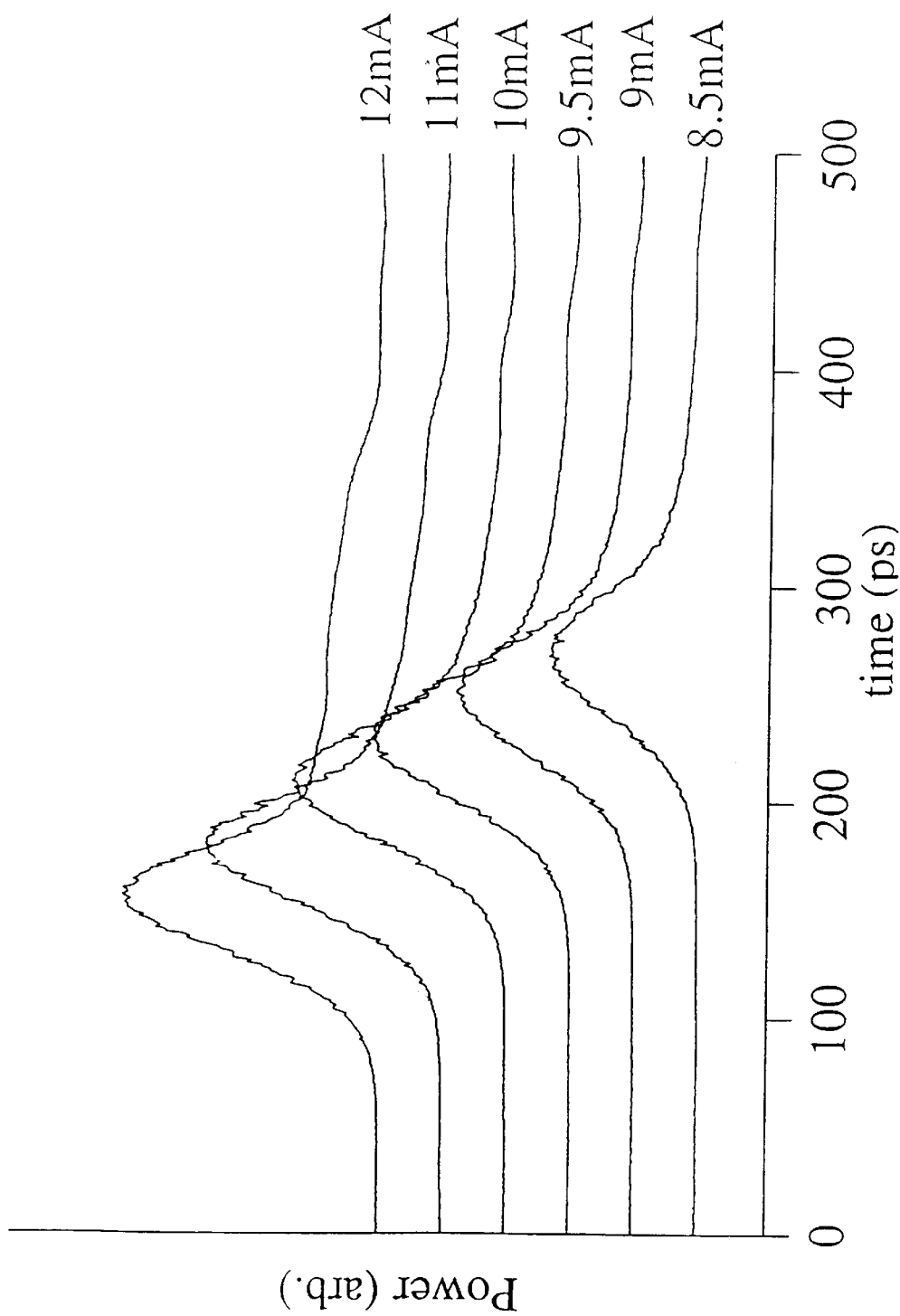
FIG. 4, is a graph of experimental results from a 1.5 μm DFB laser as a function of dc bias.
Figure 5:
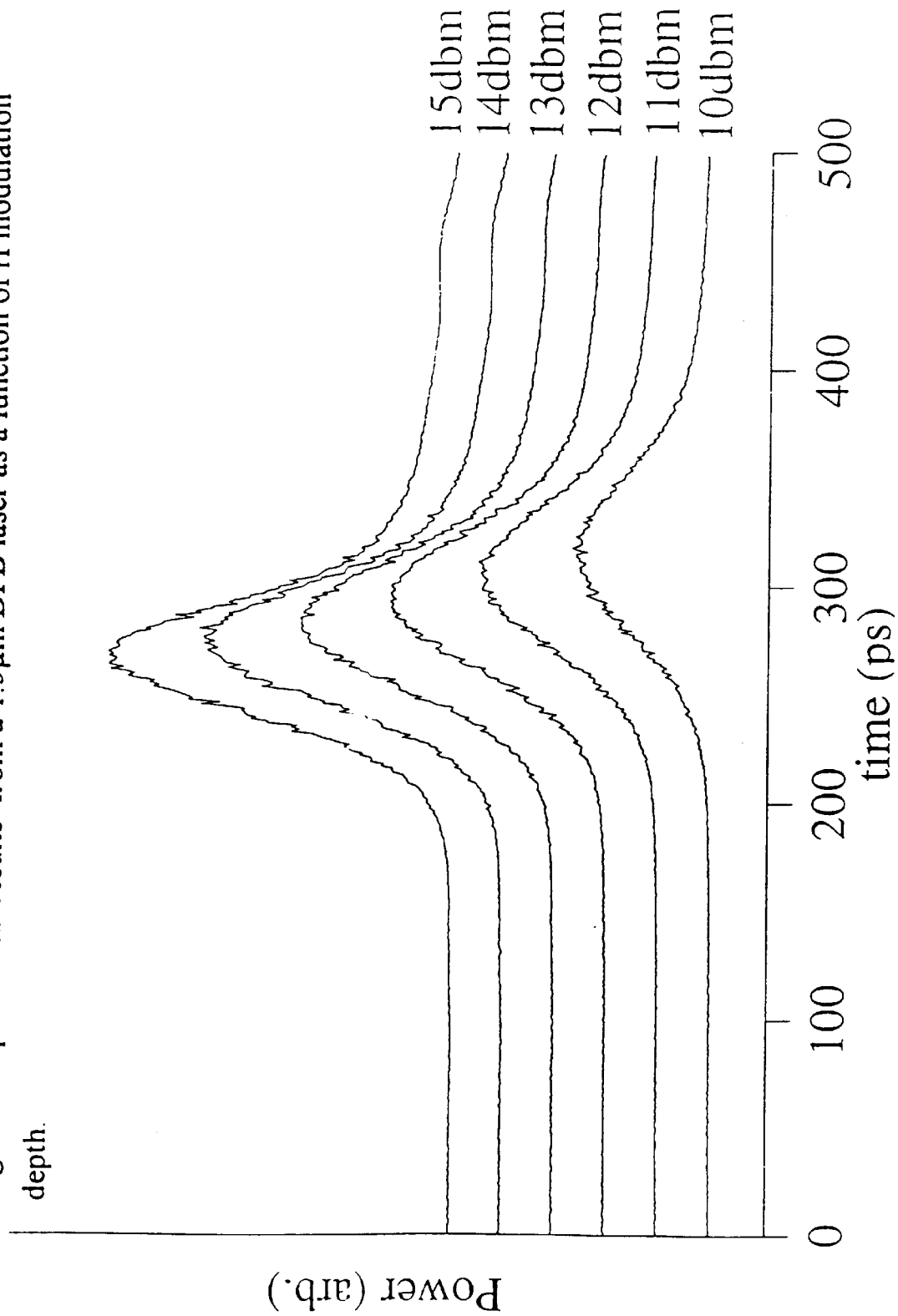
FIG. 5, is a graph of experimental results from a 1.5 μm DFB laser as a function of rf modulation depth.
Figure 6:
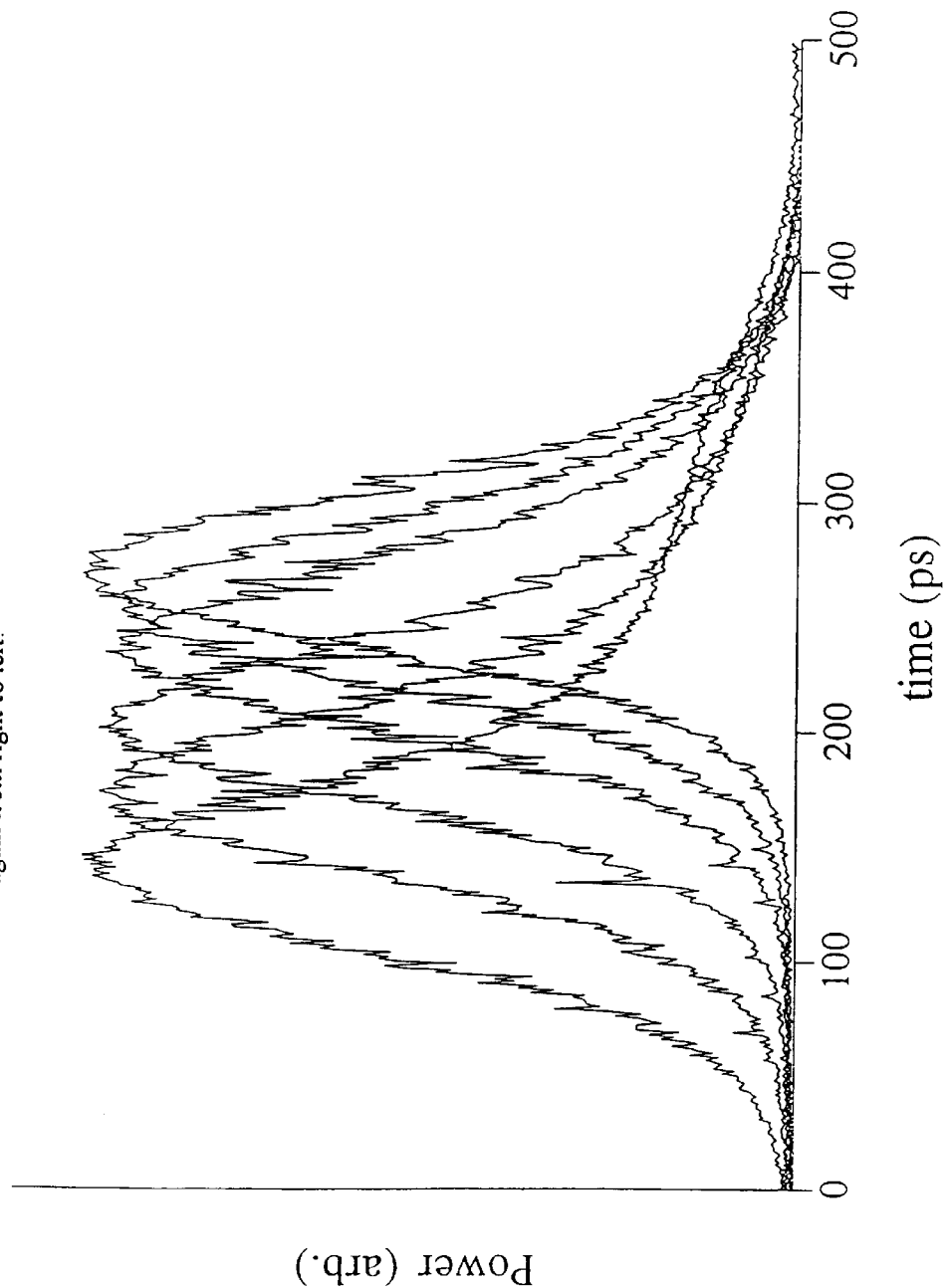
FIG. 6, is a graph of experimental results showing a pulse moving over 135 ps whilst maintaining its shape. The dc current ranges from 11 mA to 16 mA (right to left) in 1 mA steps, while the rf powers are 13 dBm, 11.8 dBm, 9.3, 7.7 dBm, 7.6 dBm and 6 dBm, again from right to left.

A test on the first part of the model was performed by gain switching a 1.5 μm telecommunication DFB laser, threshold current 14 mA, with a 1 GHz source. The dc component was varied between 8.5 mA and 12 mA with a fixed rf power of 12 dBm. The results can be seen in FIG. 4 and should be compared to the theoretical results presented in FIG. 1. The peak of the pulse moved over 120 ps and experienced changes in peak power and FWHM as predicted by our model. The second part was achieved by biasing the laser at 8 mA and varying the rf power from 10 dBm to 15 dBm. The results are given in FIG. 5, and again are similar to the theoretical results presented in FIG. 2. The adjustment of both the rf and dc components to achieve the movement of the optical pulse without alteration of the pulse shape has also been experimentally tested and results are presented in FIG. 6. Although there is still a problem with secondary pulse formations, an optical pulse can be delayed without significantly altering its shape.

Figure 7:
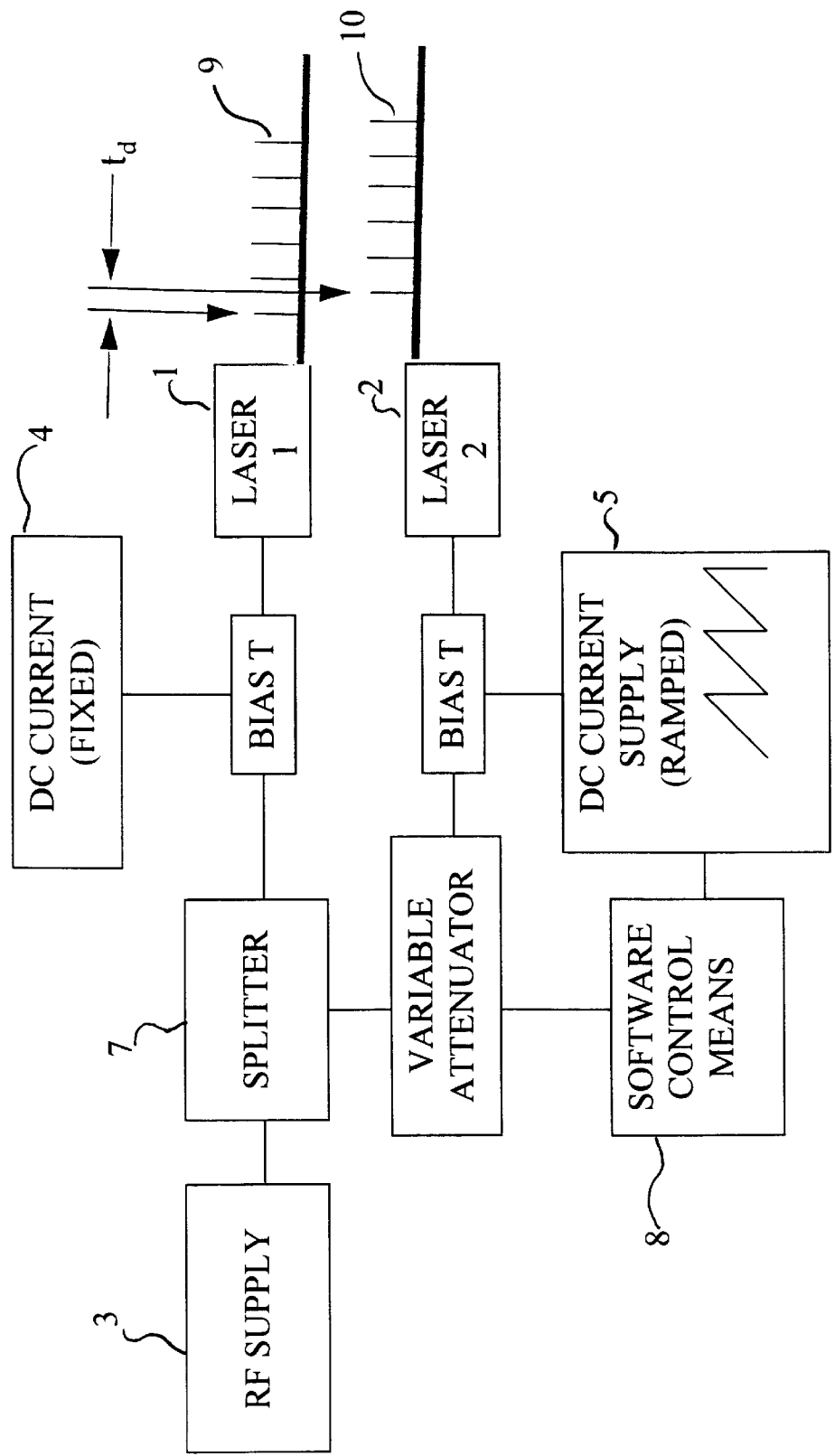
FIG. 7, is a schematic diagram of a pump-probe device with driver circuit according to the present invention.

With these results in mind, an all solid state device is proposed, which consists of two similar lasers 1,2, possibly on the same chip, driven by the same high frequency source 3 through a splitter 7 and separate dc supplies 4,5, as shown schematically in FIG. 7. One laser 1 would remain at a fixed dc and rf bias, producing the pump pulse, whilst the other laser 2 would have its dc component ramped with a rampled dc supply or dc adjusting means 5. The rf is adjusted by a variable attenuator 6 to compensate for the change in pulse shape acting as the probe. The varying dc and rf components to this laser would ideally be under the control of a software control means 8. Such a device would be able to scan across a range of a few hundred picoseconds at a frequency of several Hz and above with series of pulses 9,10, making it ideal for a fast scanning system. Furthermore, due to the amount of chirp, fibre compressors can be used to compress gain switched pulses down to a few picoseconds as described by P. GUNNING, R. KASHYAP, A. S. SIDDIQUI, and K. SMITH, Electron. Lett. 31 (1995) 1066. Although this technique is valid for any single mode laser that can be gain switched, the amount of compression will depend on the laser parameters. The incorporation of a fibre delivery system would also greatly enhance the flexibility. Although power would be lower than that obtained from a mainframe laser, it would be sufficient for many applications.

I claim:

1. A laser system comprising:

a semiconductor laser;

an ac source providing a drive signal modulating said laser;

a dc source applying a dc bias to said drive signal;

dc adjusting means for adjustably controlling a level of said dc source;

ac adjusting means for adjustably controlling said drive signal to control a depth of modulation of said laser, said ac and dc adjusting means together controlling a time period between a rising edge of said drive signal and a transmission of an optical pulse from said laser while substantially maintaining constant a shape of said pulse.

2. A method of controlling a time period between a rising edge of an ac drive signal and a transmission of an optical pulse of defined shape from a laser, the method comprising the steps of:

providing a semiconductor laser, providing an ac source creating the drive signal;

providing a dc source applying a dc bias to the drive signal;

modulating said laser with said drive signal;

adjusting said dc bias and a modulation depth of said drive signal to control the time period.

3. A method for delaying a laser pulse, the method comprising the steps of:

providing a laser;

driving said laser with a dc current and a rf current to create a pulse;

varying said dc current and said rf current to vary a timing of said pulse while maintaining a shape and power of said pulse substantially identical.

4. A method in accordance with claim 3, further comprising providing another laser, driving said another laser with another dc current and another rf current to create another pulse;

varying said dc current and said another dc current and varying said rf current and said another rf currents, to vary a relative timing of said pulse and said another pulse while maintaining a shape and power of said pulse and said another pulse substantially identical.

5. A method in accordance with claim 4, wherein:

a common rf supply creates a common rf current;

said common rf current is split into said rf current and said another rf;

said varying of said rf current and said another rf current is performed by attenuating said another rf current.

6. A method in accordance with claim 5, wherein:

said rf current and said another rf current are in phase;

said another dc current and said another rf current is continuously varied to continuously vary a relative timing of said pulse and said another pulse.

7. A method in accordance with claim 4, wherein:

said rf current and said another rf current are in phase.

8. A method in accordance with claim 4, wherein:

said another dc current and said another rf current is continuously varied to continuously vary a relative timing of said pulse and said another pulse.

9. A method in accordance with claim 4, wherein:

said rf current and said another rf current is varied by varying a modulation depth of said rf current and said another rf current.

10. A method in accordance with claim 4, wherein:

said driving of said laser and said another laser produces a series of pulses and a another series of pulses respectively;

said varying of said dc current and said another dc current and said varying of said rf current and said another rf current is continuous in order to continuously vary a timing between said series of pulses and said another series of pulses.

11. A method in accordance with claim 10, wherein:

said timing of said series of pulses and another series of pulses is relative to each other.

12. A method in accordance with claim 11, wherein:

a common rf supply creates a common rf current;

said common rf current is split into said rf current and said another rf current;

said varying of said rf current and said another rf current is performed by attenuating said another rf current;

said rf current and said another rf current are in phase.

13. A method in accordance with claim 10, wherein:

said rf current and said another rf current is varied by varying a modulation depth of said rf current and another rf current.

* * * * *